US011661042B2

United States Patent
Goers et al.

(10) Patent No.: US 11,661,042 B2
(45) Date of Patent: May 30, 2023

(54) METHOD FOR OPERATING A ROTATIONAL SPEED SENSOR IN A VEHICLE, AND SENSOR ASSEMBLY

(71) Applicant: WABCO GmbH, Hannover (DE)

(72) Inventors: Andreas Goers, Pattensen (DE); Julian Van Thiel, Großburgwedel (DE); Oliver Wulf, Neustadt (DE)

(73) Assignee: ZF CV Systems Hannover GmbH, Hannover (DE)

(*) Notice: Subject to any disclaimer, the term of this patent is extended or adjusted under 35 U.S.C. 154(b) by 782 days.

(21) Appl. No.: 16/617,122

(22) PCT Filed: Apr. 19, 2018

(86) PCT No.: PCT/EP2018/060061
§ 371 (c)(1),
(2) Date: Nov. 26, 2019

(87) PCT Pub. No.: WO2018/219553
PCT Pub. Date: Dec. 6, 2018

(65) Prior Publication Data
US 2020/0254986 A1    Aug. 13, 2020

(30) Foreign Application Priority Data

May 27, 2017    (DE) .................. 102017005071.6

(51) Int. Cl.
*B60T 8/171*    (2006.01)
*B60T 8/88*    (2006.01)
(Continued)

(52) U.S. Cl.
CPC .............. *B60T 8/171* (2013.01); *B60T 8/885* (2013.01); *B60T 17/221* (2013.01); *G01P 3/488* (2013.01);
(Continued)

(58) Field of Classification Search
CPC ............. B60T 17/221; B60T 2270/406; B60T 2270/413; B60T 2270/416; B60T 8/172;
(Continued)

(56) References Cited

U.S. PATENT DOCUMENTS 6,244,675 B1    6/2001 Behrends et al.
6,339,322 B1 *  1/2002 Loreck .................. G01P 3/44
                                              324/207.25
(Continued)

FOREIGN PATENT DOCUMENTS

DE    19814097 C1    3/2000
DE    19840944 A1    3/2000
(Continued)

OTHER PUBLICATIONS

International Search Report for PCT/EP2018/060061 dated Aug. 10, 2018, 3 pages.
(Continued)

*Primary Examiner* — Catherine T. Rastovski
*Assistant Examiner* — Kaleria Knox
(74) *Attorney, Agent, or Firm* — Warner Norcross + Judd LLP

(57) ABSTRACT

Disclosed is a method for operating a rotational speed sensor comprising a sensor element in a vehicle, wherein the sensor element interacts with a magnet wheel on a wheel of the vehicle and an effective parameter generated by the interaction of the magnet wheel with the sensor element is evaluated in the form of a measurand in an evaluation module and, depending on the measurand, an output variable characterizing the rotational speed of the wheel is output, wherein the sensor element is supplied via the evaluation module with a sensor voltage influencing the measurand. A sensor assembly is also disclosed.

10 Claims, 6 Drawing Sheets

(51) Int. Cl.
    *B60T 17/22*     (2006.01)
    *G01P 3/488*     (2006.01)
    *G01P 21/02*     (2006.01)
    *G07C 5/08*     (2006.01)
    *G01P 21/00*     (2006.01)
    *G01R 31/00*     (2006.01)

(52) U.S. Cl.
    CPC .............. *G01P 21/00* (2013.01); *G01P 21/02* (2013.01); *G01R 31/005* (2013.01); *G07C 5/0808* (2013.01); *B60T 2270/406* (2013.01); *B60T 2270/413* (2013.01); *B60T 2270/416* (2013.01)

(58) Field of Classification Search
    CPC . G01P 3/488; G01P 21/02; G01P 3/44; G01R 31/005; G07C 5/00808; G06F 11/0745; H02J 9/06
    See application file for complete search history.

(56) References Cited

U.S. PATENT DOCUMENTS

| | | | | |
|---|---|---|---|---|
| 7,099,795 | B1 * | 8/2006 | Gerstenmeier | B60T 8/171 73/488 |
| 9,465,683 | B2 * | 10/2016 | Slama | G06F 11/0745 |
| 2008/0174181 | A1 * | 7/2008 | Kuo | H02J 9/06 307/80 |
| 2008/0303513 | A1 * | 12/2008 | Turner | G01P 3/488 324/160 |
| 2011/0131455 | A1 | 6/2011 | Law et al. | |
| 2015/0168506 | A1 | 6/2015 | Klotzbuecher et al. | |
| 2017/0059526 | A1 | 3/2017 | Grambichler et al. | |
| 2018/0148027 | A1 * | 5/2018 | Fehrenbacher | B60T 8/172 |

FOREIGN PATENT DOCUMENTS

| | | |
|---|---|---|
| DE | 10041989 A1 | 3/2002 |
| DE | 10326988 B3 | 4/2005 |
| DE | 102005013028 A1 | 10/2006 |
| DE | 102010037262 A1 | 4/2011 |
| DE | 102012212272 A1 | 1/2014 |
| DE | 102015209565 A1 | 12/2016 |
| DE | 102016216174 A1 | 3/2017 |
| EP | 0883536 B1 | 12/2003 |
| EP | 1478072 A2 | 11/2004 |

OTHER PUBLICATIONS

Shi F et al., "Integrated power systems with fault tolerant attributes", Applied Power Electronics Conference and Exposition, 1997, APEC '97 Conference Proceedings, 1997, Twelfth Annual Atlanta, GA, USA 23-27 Feb. 1, New fork, NY, USA, vol. 1, Feb. 23, 1997, pp. 443-447.

Machine assisted English translation of DE10041989A1 obtained from https://patents.google.com dated Feb. 26, 2020, 6 pages.

Machine assisted English translation of DE10326988B3 obtained from https://worldwideespacenet.com dated Feb. 26, 2020, 35 pages.

Machine assisted English translation of DE19814097C1 obtained from https://patents.google.com dated Feb. 26, 2020, 21 pages.

Machine assisted English translation of DE102005013028A1 obtained from https://patents.google.com dated Feb. 26, 2020, 5 pages.

\* cited by examiner

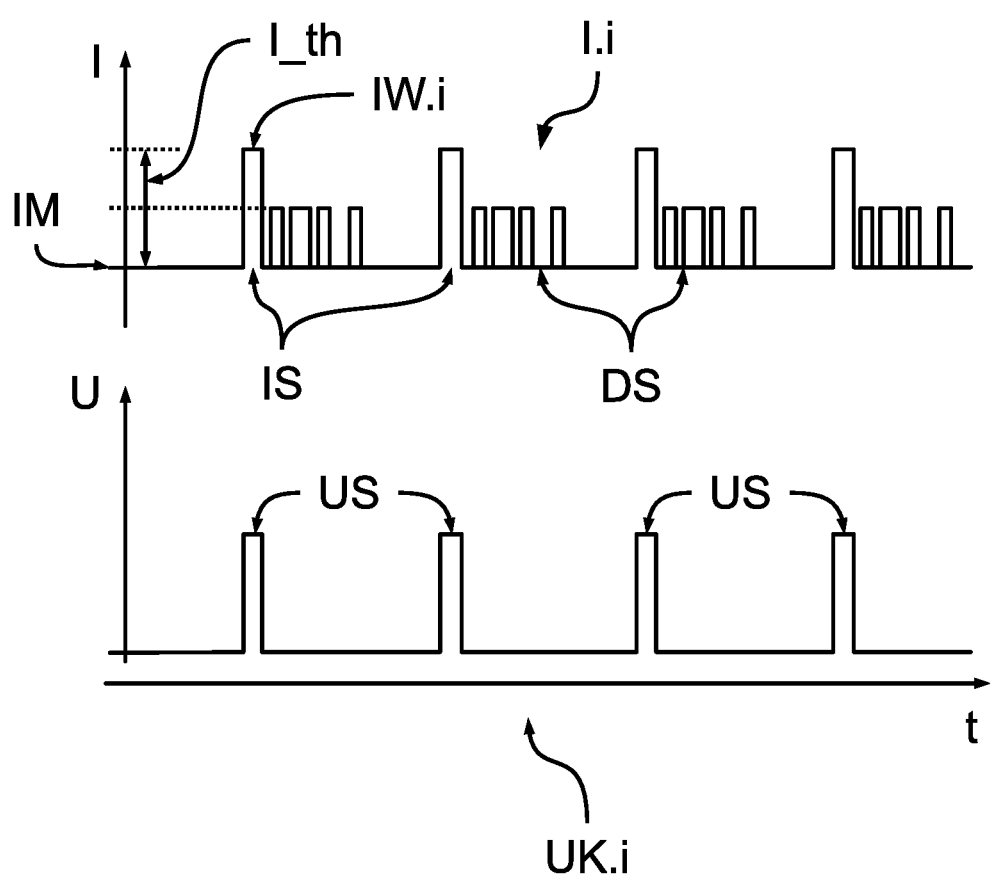

METHOD FOR OPERATING A ROTATIONAL SPEED SENSOR IN A VEHICLE, AND SENSOR ASSEMBLY

CROSS-REFERENCE TO RELATED APPLICATIONS

This application is the National Stage of International Application No. PCT/EP2018/060061, filed on 19 Apr. 2018, which claims priority to and all advantages of German Patent Application No. 10 2017 005 071.6, filed on 27 May 2017, the con-tents of which are hereby incorporated by reference.

FIELD OF THE INVENTION

The invention generally relates to a method for operating a rotational speed sensor in a vehicle, and a to sensor assembly having at least one rotational speed sensor for carrying out the method.

BACKGROUND OF THE INVENTION

Rotational speed sensors in a vehicle, in particular a utility vehicle, are used to detect the rotation behavior of a wheel and the measured rotation speeds are used for a driving dynamics control system, for example, an anti-lock braking system (ABS) or a traction control system (TCS). This allows instabilities in the vehicle to be avoided if this type of monitoring of the rotation speeds can take place, for example, on each wheel of the vehicle and braking can be applied to individual wheels in accordance with the monitoring result.

Such a rotational speed sensor can be operated inductively or actively. An inductive rotational speed sensor has, for example, a coil winding as the sensor element and an active speed sensor has, for example, a Hall sensor as the sensor element. A magnet wheel, having magnetic teeth and magnet gaps, that co-rotates with the wheel induces or generates in the respective sensor element a different effective voltage or a variable effective current depending on the distance, each of which can be processed by an evaluation module of the rotational speed sensor and output in an appropriate form to be able to determine the rotation speed of the wheel via a calibration.

In this arrangement, depending on the effective parameter generated in the respective sensor element, the evaluation module firstly outputs an analog measurand, e.g. a measured voltage, and secondly a comparator voltage output. The analog measured voltage is substantially proportional to the effective parameter generated in the sensor element and the comparator voltage is output in the form of a square-wave voltage, which indicates whether the measuring voltage deviates above or below a certain threshold, i.e., whether a certain measuring voltage is generated by a possible movement of the magnet wheel. If a deviation by more than the threshold value is present, a voltage pulse is generated and output via the comparator voltage. From the square-wave voltage it is thus possible to deduce the rotation speed of the wheel, if the number of magnetized teeth of the magnet wheel is known. Such a mode of operation is shown in EP 0 883 536 B1, for example.

With the analog measured voltage, for example, a plausibility check or monitoring of the function of the rotational speed sensor can be carried out, for example by checking whether an amplitude or a voltage value of the analog measured voltage at least tends to agree with the level of the rotation speed determined from the comparator voltage.

The energy supply of the rotational speed sensor in the vehicle is conventionally provided by the evaluation module, which is connected, for example, to an energy source of the vehicle, for example to a vehicle battery or an alternator, and provides a sensor voltage required for the measurement and evaluation, in particular to supply the respective sensor element.

To ensure a secure and reliable ABS or TCS control using such rotational speed sensor in what may be a purely electronically controlled braking system (EBS), an electrical operability of all speed sensors must be provided. This is why, for example, the plausibility check of the two voltages or signals takes place, as described above. If a failure or a malfunction has been detected, in the context of the driving dynamics control, however, an adequate response to a specific instability can no longer be ensured. To avoid this, a redundant rotational speed sensor can be provided on each wheel with a redundant energy source and redundant evaluation module, so that upon detection of a failure or a malfunction, the failed rotational speed sensor or sensors can be replaced and the wheel rotation speeds can therefore continue to be accessed.

A disadvantage of this is that such a redundancy is very expensive and takes up a large amount of space to the wheels or axes of the vehicle. Also, in the event of a failure the power supply of the respective rotational speed sensor or the evaluation module, recourse to a different speed sensor is not absolutely necessary.

BRIEF SUMMARY OF THE INVENTION

Disclosed is a method for operating a rotational speed sensor comprising a sensor element in a vehicle, wherein the sensor element interacts with a magnet wheel on a wheel of the vehicle. The method comprises evaluating an effective parameter generated by the interaction of the magnet wheel with the sensor element in the form of a measurand in an evaluation module and, depending on the measurand, outputting an output variable characterizing the rotational speed of the wheel. The sensor element is supplied via the evaluation module with a sensor voltage influencing the measurand. The method further comprises monitoring the functional capability of the evaluation module to establish whether the sensor element is or can be supplied from the evaluation module with the sensor voltage, wherein, in the event of a malfunction of the evaluation module as a result of which the sensor element no longer is or can be supplied with the sensor voltage from the evaluation module, a redundancy sensor voltage is provided by a redundancy module independent of the evaluation module, the sensor element instead being supplied with the voltage so as to form a redundant voltage supply of the sensor element.

BRIEF DESCRIPTION OF THE DRAWINGS

The invention is described in greater detail below with reference to the accompanying figure, in which:

FIG. 3b shows an exemplary profile of a measuring current generated by the active rotational speed sensor in accordance with FIG. 3a during rotation of the wheel.

DETAILED DESCRIPTION

Figure 1A:
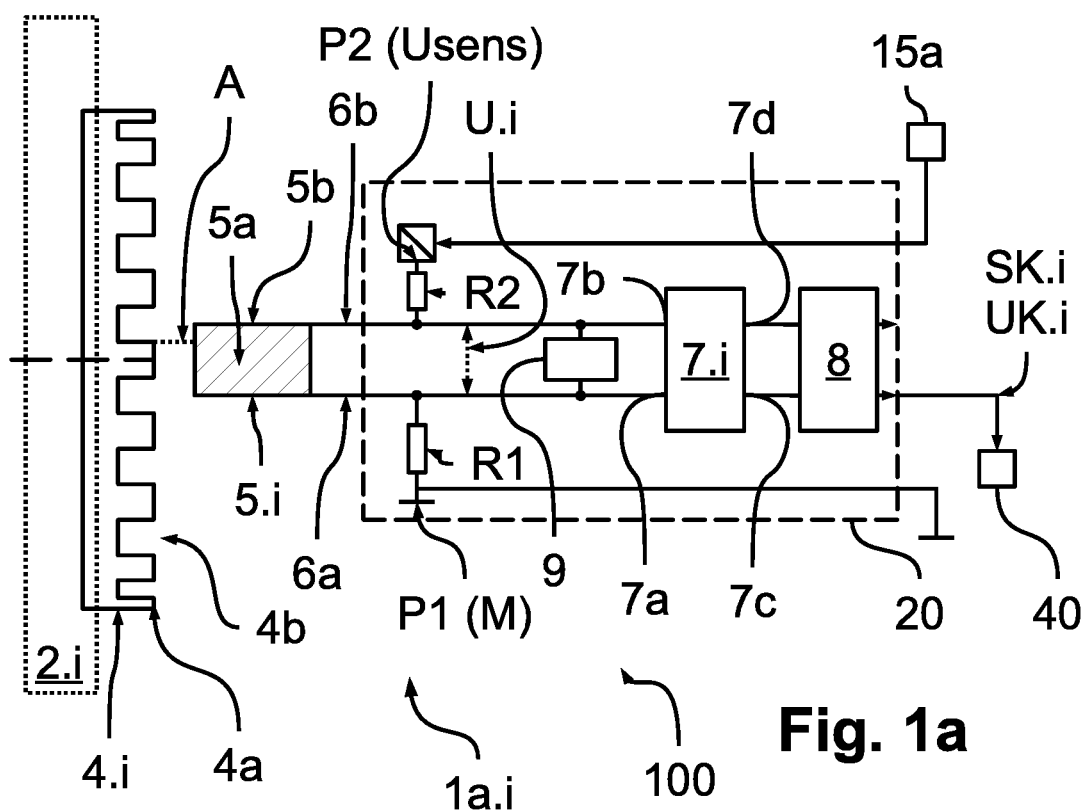
FIG. 1a shows a schematic view of an inductive rotational speed sensor assigned to a wheel of a vehicle.

The method of the invention monitors the functionality of an evaluation module as to whether a sensor element of a rotational speed sensor is or can be supplied with a sensor voltage by the evaluation module. In the event of a malfunction of the evaluation module, as a result of which the sensor element no longer is or can be supplied with the sensor voltage by the evaluation module and therefore a reliable evaluation of the rotation behavior of the wheel can no longer be ensured, a redundancy sensor voltage is provided by a redundancy module independent of the evaluation module, with which the sensor element is supplied instead.

According to the invention it is thus already detected that in a sensor assembly having one or more speed sensors, the sensor elements of which are supplied with a sensor voltage in the normal operation of the evaluation module, in the event of a malfunction in the evaluation module it is not necessary to rely on redundant sensor elements or to suspend the operation of the speed sensor, but instead an independent redundant power supply to the sensor elements can be provided so that the operation of the speed sensor can be continued redundantly. Therefore, cost and space savings can be made and the rotation behaviour of the wheel can continue to be used, for example, for a driving assistance control, for example, a brake slippage control and/or traction control system.

In specific embodiments, in the event of a malfunction of the evaluation module, as a result of which the sensor element no longer is or can be supplied with the sensor voltage by the evaluation module, an effective parameter, for example an induced effective voltage or a controlled effective current, generated by an interaction of a magnet wheel connected to the wheel with the sensor element, is evaluated in the form of a redundancy measurand in the redundancy module. Depending on the redundancy measurand, the redundancy module can output a redundancy output variable characterizing the rotation speed of the wheel.

Advantageously, this enables a redundant evaluation to be achieved, since the redundancy module can also evaluate the recorded measurands and output them, processed accordingly, independently of the evaluation module. The redundancy module therefore automatically assumes the full function of the evaluation module in the event of a malfunction, since after the malfunction is detected it must be assumed that not only has the supply of the sensor elements with the sensor voltage failed, but processing of the measurands can also no longer take place.

In various embodiments, upon detection of a malfunction the redundancy sensor voltage can be provided by the redundancy module in such a way that redundancy supply points of the redundancy module are electrically conductively connected to the sensor element via redundancy lines, in such a way that the sensor element can be supplied with the redundancy sensor voltage provided via the redundancy supply points. If there is no malfunction, the redundancy supply points, on the other hand, are electrically isolated from the sensor element.

This will advantageously ensure that the redundancy sensor voltage provided independently of the sensor voltage is only applied to the sensor elements when needed, so that in normal operation, i.e. without a malfunction present, the evaluation is not significantly affected by the operation of the redundancy module.

To connect and disconnect the redundancy supply points to or from the sensor element when required, electrical switches are generally provided, which can be opened or closed under electrical control depending on the functionality of the evaluation module. This specifies a simple way of enabling the redundant intervention, wherein the electrical switches are controlled, for example, by a redundancy monitoring module in the redundancy module which performs the monitoring of the evaluation module function.

In certain embodiments, the redundancy module monitors a diagnostic signal output by the evaluation module, wherein the diagnostic signal indicates whether the sensor element is or can be supplied with the sensor voltage via the evaluation module. The diagnostic signal can be determined in a self-diagnosis in the evaluation module and continuously transmitted to the redundancy module. This provides a simple way of monitoring, as a result of which it is decided whether the redundancy module has to intervene redundantly.

In accordance with an alternative or supplementary embodiment, further sensor elements of a sensor assembly are incorporated to monitor the functioning of the evaluation module. To do so, at least the following steps are carried out in the redundancy module:

Firstly, a redundancy measurand appearing in the redundancy module can be detected, wherein the redundancy measurand results from the interaction of the magnet wheel with the sensor element, which is supplied with a certain sensor voltage. It can subsequently be determined whether this redundancy measurand indicates that the sensor element is supplied with a sensor voltage, which corresponds to a ground potential within a fault tolerance.

It can thus first be detected in a simple way, whether for at least one sensor module in the redundancy module, a redundancy measurand is detected that indicates a lack of power supply to the relevant sensor element via the evaluation module. In order to distinguish whether this is caused by a sensor defect or by the fact that a sensor voltage is no longer being provided by the evaluation module, it is typically also provided, for additional sensor elements of other rotational speed sensor of the same sensor assembly that are also supplied with the sensor voltage by the same evaluation module and are also monitored by the redundancy module for a malfunction, to test whether the redundancy measurands associated with the other sensor elements also indicate a sensor voltage that corresponds to a ground potential within the fault tolerance. Only if this is the case is a malfunction of the evaluation module concluded, as a result of which the sensor element no longer is or can be supplied with the sensor voltage by the evaluation module.

As a result, by recourse to other sensor elements it is determined whether the power supply to these is also lacking or impaired and from this a corresponding malfunction of the evaluation module is concluded, as a result of which the redundancy module redundantly intervenes to provide the supply and evaluation.

In specific embodiments, if a stationary state of the wheel is detected it is additionally determined whether the redundancy measurand corresponds to a median voltage and/or a median current, which appears when the wheel is stationary due to supplying the sensor element with the sensor voltage without any interaction of the sensor element with the magnet wheel. Thus, even in the stationary condition of the wheel an evaluation can advantageously be carried out as to whether the presence of the sensor voltage causes a corresponding measurand or redundancy measurand to be generated, which disappears without the presence of the sensor voltage.

Furthermore, after the detection the redundancy measurand can be first plausibility-checked, wherein to do so, in a redundancy comparator module of the redundancy module a redundancy comparator voltage or a redundancy comparator signal are generated as an output variable, which specify whether, as a result of an interaction of the sensor element with a magnet wheel tooth of the magnet wheel, the redundancy measurand deviates by more than a threshold from the median voltage or the median current. From a comparison of the redundancy measurand with the redundancy comparator voltage or the redundancy comparator signal it is possible to determine inconsistencies in the recorded redundancy measurand and therefore the rotation speed based thereon. Thus, the monitoring can be already aborted, for example, if an implausible or reasonable rotation speed is derived from the redundancy measurand or the redundancy comparator voltage/signal.

Therefore, during the normal monitoring operation the redundancy module is first in a passive operating mode, in which the effective parameter of the respective sensor element is merely "observed" via the respective redundancy measurand, and no supply of the respective sensor element takes place via the redundancy module. The evaluation module, on the other hand, is in an active operating mode in which both an observation of the respective effective parameter takes place via the respective measuring voltage and a supply of the respective sensor element via the sensor voltage. Once a malfunction is detected according to the above designs, the redundancy module becomes active and the evaluation module becomes passive.

The respective measurands or redundancy measurands can take the form of a voltage or a current, depending on the type of sensor element. For example, if an inductive sensor element is provided, an induced effective voltage is specified as the effective parameter, which when superimposed on the median voltage is processed as a measured voltage in the evaluation module or as a redundant measured voltage in the redundancy module. In the case of an active sensor element, such as a Hall sensor element, an effective current is specified as the effective parameter, which when superimposed on the median current is processed as a measured current or redundancy measured current in the evaluation module or the redundancy module, respectively.

A sensor assembly for a vehicle is also provided by the invention, particular for a utility vehicle, which is suitable in particular for carrying out the method described above for operating a rotation speed sensor, wherein the sensor assembly has at least one rotational speed sensor each with one sensor element and the sensor element can interact with a magnet wheel that can be fixed to a wheel, so that an effective parameter is generated in the sensor element, which characterizes the rotation speed of the wheel. The processing module can supply all rotational speed sensor of the sensor assembly with the sensor voltage in normal operation and evaluate the effective parameter, which is generated as a result of the interaction between the at least one sensor element that is supplied with the sensor voltage and the magnet wheel in the form of the measurand. As a function thereof, an output variable characterizing the rotation speed of the respective wheel can be output by the evaluation module, so that an open-loop and/or closed-loop control can thereby be carried out.

Furthermore, the redundancy module is part of the sensor assembly, which as described above can monitor the functional capacity of the evaluation module and, if necessary, also assumes the function of the evaluation module so as to ensure the supply of the sensor elements and thereupon can also perform the evaluation of the detected effective parameters. The evaluation module in this case is designed substantially identically to the redundancy module, wherein the redundancy module has additional electrical switches, which upon detecting a malfunction and with a view to performing the task redundantly, ensure that the sensor element is supplied with the redundancy sensor voltage.

To ensure a reliable operation, the evaluation module and the redundancy module are connected to different energy sources that are independent of one another. This can advantageously ensure that, in the event of a failure of the energy source of the evaluation module, as a result of which the sensor voltage can no longer be provided and possibly an evaluation can no longer be performed, the redundancy module can continue to intervene redundantly.

With reference to the specific embodiment of the Figures, wherein like numerals generally indicate like parts throughout the several views, FIG. 1a shows an inductive speed sensor 1a.i, which is assigned to a particular wheel 2.i of a vehicle 100 and is designed to output an output variable SK.i, UK.i characterizing the rotation speed D.i of the wheel 2.i. The index i indicates that in the vehicle 100 further inductive speed sensors 1a.i can be present on other wheels 2.i, which can be operated in exactly the same way as described in the following:

A magnetic, for example ferromagnetic, magnet wheel 4.i is therefore provided, which co-rotates with the respective wheel 2.i, having magnetic teeth 4a and pole gaps 4b, which moves at a distance apart from an inductive sensor element 5.i of the respective rotational speed sensor 1a.i and is therefore located at different distances A from the inductive sensor element 5.i depending on the rotation angle.

The inductive sensor element 5.i has a magnetic core 5a and a coil winding 5b at least partially surrounding the core 5a, which is connected to two sensor cables 6a, 6b so that an inductive component is formed, in which an effective voltage UW.i—or else induction voltage—can be induced depending on the distance A from the ferromagnetic magnet wheel 4.i. Due to a movement of the magnet wheel 4.i a magnetic tooth 4a and a pole gap 4b is alternately introduced into the magnetic field, which induces a voltage in the coil winding 5b of the inductive sensor element 5.i. The greater the speed of the magnet wheel 4.i, the greater the frequency and the amplitude of the induced voltage. Thus, upon rotation of the magnet wheel 4.i or of the wheel 2.i an oscillating effective voltage UW.i is generated, which characterizes the speed D of the wheel 2.i.

Figure 1B:
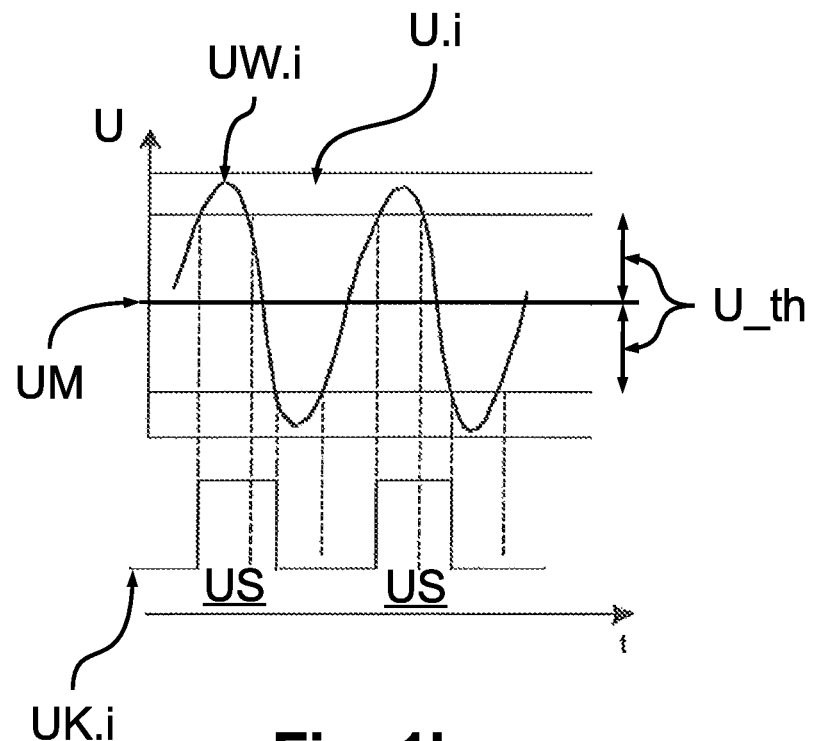
FIG. 1b shows an exemplary profile of a measuring voltage generated by the inductive speed sensor in accordance with FIG. 1a during rotation of the wheel.

The effective voltage UW.i is superimposed on a median voltage UM and fed via the sensor cables 6a, 6b to an evaluation module 20, wherein in the evaluation module 20, a voltage composed of the effective voltage UW.i and the median voltage UM—hereafter referred to as the measured voltage U.i—is transmitted, processed and evaluated. The active voltage in the evaluation module 20 is thus referred to as the measured voltage U.i. An example of the measured voltage U.i for a rotational speed sensor 1a.1 is shown in FIG. 1b.

The median voltage UM is generated by the fact that the first sensor cable 6a, connected to the coil winding 5b in accordance with FIG. 1a, is connected via a first load resistor R1 to a first supply point P1 which is at ground potential M. The second sensor cable 6b, also connected to the coil winding 5b, is connected via a second load resistor R2 to a second supply point P2, to which a certain sensor supply voltage Usens of, for example, 5V is connected. The sensor voltage USens is provided via an appropriate limiting of the supply voltage supplied by a first energy source 15a. As a result, both sensor cables 6a, 6b, and thus also the coil 5b, are always at a non-negative potential, which leads to a raising of the effective voltage UW.i by the median voltage UM.

On the basis of the applied median voltage UM, even without a rotation of the magnet wheel 4.i, i.e. if the respective wheel 2.i is at a standstill or is blocked, and therefore without an effective voltage UW.i induced in the coil winding 5b, in the evaluation module 20 a measured voltage U.i can already be measured, which in normal operation, i.e. without a malfunction of the evaluation module 20, corresponds approximately to the median voltage UM. The median voltage UM in this exemplary embodiment is slightly less than half of the sensor voltage Usens.

To evaluate the measuring voltage U.i, within the evaluation module 20 a comparator module 7.i is provided, which has two comparator inputs 7a, 7b and two comparator outputs 7c, 7d. The comparator inputs 7a, 7b are each connected to one of the sensor cables 6a, 6b, so that the measured voltage U.i is fed to the comparator module 7.i and can be processed thereby.

The comparator module 7.i in the evaluation module 20 is used to generate an output variable SK.i, UK.i, which in accordance with FIG. 1b is given by a square-wave voltage which is output as a comparator voltage UK.i via a comparator output 7c of the comparator module 7.i, wherein the square-wave voltage characterizes the rotation speed D.i of the magnet wheel 4.i and thus also the rotational behavior of the wheel 2.i. Alternatively, the comparator module 7.i can also output a comparator signal SK.i, which in a manner comparable with that of the square-wave voltage characterizes the rotation speed D.i of the magnet wheel 4.i, for example, in the form of a binary number string.

The comparator voltage UK.i or else the comparator signal SK.i as output variables of the comparator module 7.i and also of the evaluation module 20 can be accepted, for example, by a driving assistance control module 40, which is designed to respond to a case of brake slippage or a case of drive slippage with a braking intervention, so as to perform an appropriate open-loop and/or closed-loop control. The driving assistance control module 40 can be integrated directly on the vehicle axle in or on one of the axle modulators (not shown), or separately in a central module that controls a braking system (not shown).

The comparator voltage UK.i is compared in FIG. 1b with the measured voltage U.i as an example. The comparator voltage UK.i in this case is generated as follows: an electronic component arranged in the comparator module 7.i, such as one or more comparators or a comparable control electronics, first receives the oscillating measured voltage U.i and compares this continuously with a voltage threshold value U_th, which points away from the median voltage UM in both voltage directions. If there is a positive deviation from the median voltage UM by more than the voltage threshold value U_th, the comparator module 7.i generates a voltage level US until in the further course of the oscillating measured voltage U.i a negative deviation from the median voltage UM by more than the voltage threshold U_th also exists. Then, the comparator voltage UK.i is switched back to the output value until the U.i measuring voltage again deviates positively from the median voltage UM by more than the voltage threshold U_th.

This generates a square-wave voltage in which a voltage level US occurs whenever a magnet tooth 4a passes the inductive sensor element 5.i and therefore an effective voltage UW.i is induced, which gives rise to a sufficient deviation of the measured voltage U.i from the median voltage UM. From the temporal response of the square-wave voltage and/or the comparator voltage UK.i, having knowledge of the number of magnet teeth 4a of the magnet wheel 4.i, the rotational behavior or the rotation speed D.i of the respective wheel 2.i can be deduced. In a similar way the comparator signal SK.i can also be generated.

At an analog output 7d of the comparator module 7.i the measured voltage U.i is output essentially unchanged as an analog voltage or as an analog measurement signal. The measured voltage U.i or the measurement signal can be used to monitor the functioning of the inductive rotational speed sensor 1a.i by comparing the measured voltage U.i or the measurement signal, for example in a monitoring module 8, with the comparator voltage UK.i or with the comparator signal SK.i and using this for a plausibility check of the comparator voltage UK.i or the comparator signal SK.i or the resulting rotation speed D.i. Furthermore, it can be verified whether the median voltage UM can be measured with the wheel 2.i at a standstill.

To provide a filtering of the measured voltage U.i, a filter arrangement 9 can be additionally provided in front of the comparator module 7.i in the evaluation module 20, which filters out unwanted fluctuations or effects.

If more than one inductive rotational speed sensor 1a.1 is provided, i.e. for i>1, in a corresponding way sensor cables 6a, 6b must be routed to the processing module 20 for each inductive sensor element 5.i, wherein to evaluate the effective voltage UW.i each inductive sensor element 5.i is also assigned a comparator module 7.i, to which the corresponding measured voltage U.i is fed, as described. A supply with the sensor voltage Usens is provided for all inductive sensor elements 5.i, however, originating from the same supply points P1, P2 in the evaluation module 20 (see FIG. 2a), wherein each sensor element 5.i for each supply point P1, P2 is assigned a load resistor R1, R2 to achieve a decoupling of the two supply circuits.

The comparator module or modules 7.i with the respective comparator inputs 7a, 7b and the comparator outputs 7c, 7d, if appropriate the filter arrangement(s) 9, the supply points P1 (M), P2 (Usens), the monitoring module 8, and the respective connection cables for tapping off and transmitting in particular the respective measuring voltage U.i thus form the common evaluation module 20 of the inductive speed sensor or sensors 1a.i, which is used to convert the effective voltage(s) UW.i generated by the inductive sensor element or elements 5.i in the manner described above into comparator voltage(s) UK.i or comparator signal(s) SK.i, so that based thereon a rotation speed D.i of each wheel 2.i can be deduced, or this can be used for a driving assistance control system.

Figure 2A:
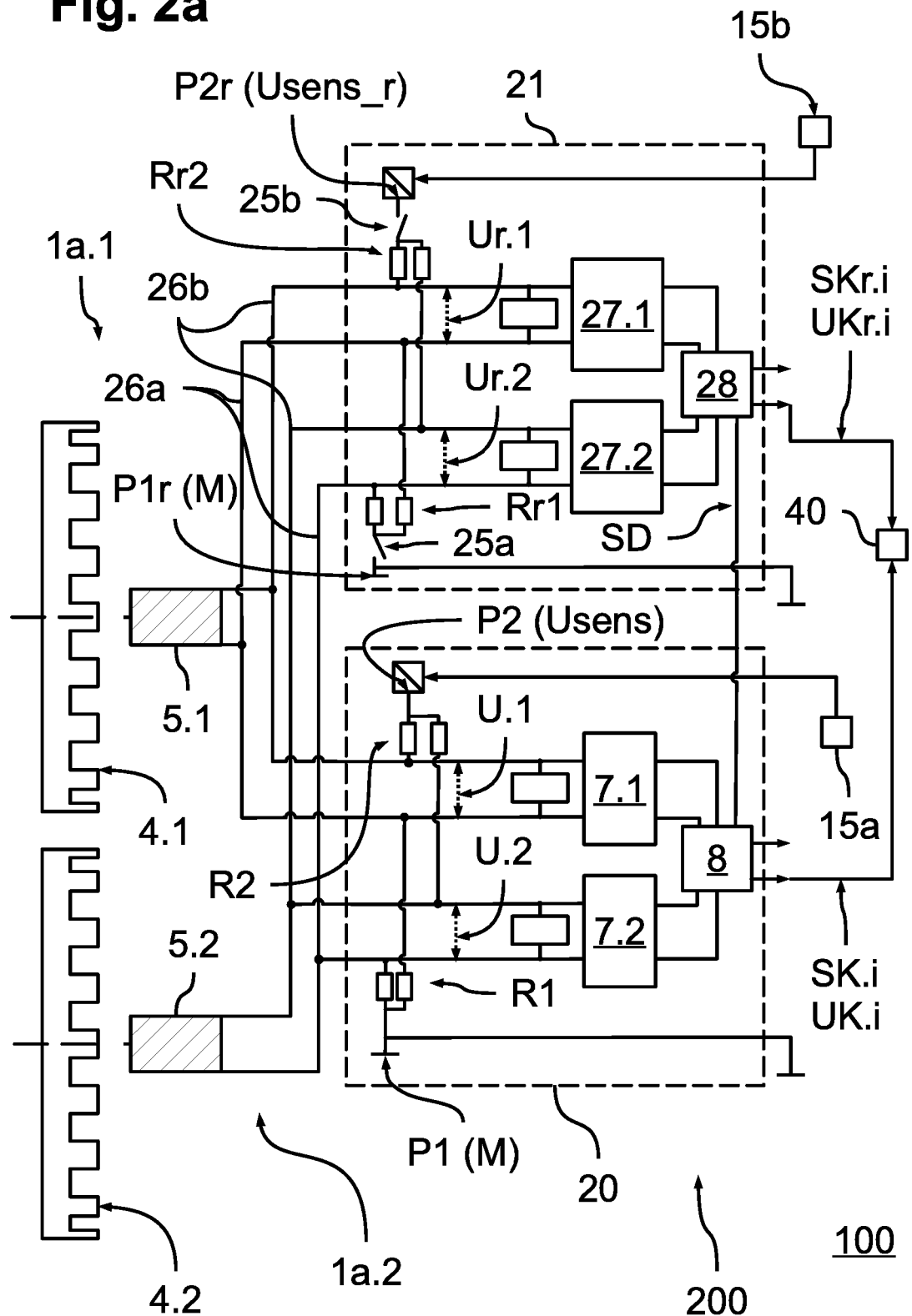
FIGS. 2a, 2b show schematic views of an inductive sensor assembly with two inductive rotational speed sensor according to FIG. 1a in a normal operation and in the case of a malfunction.
Figure 2B:
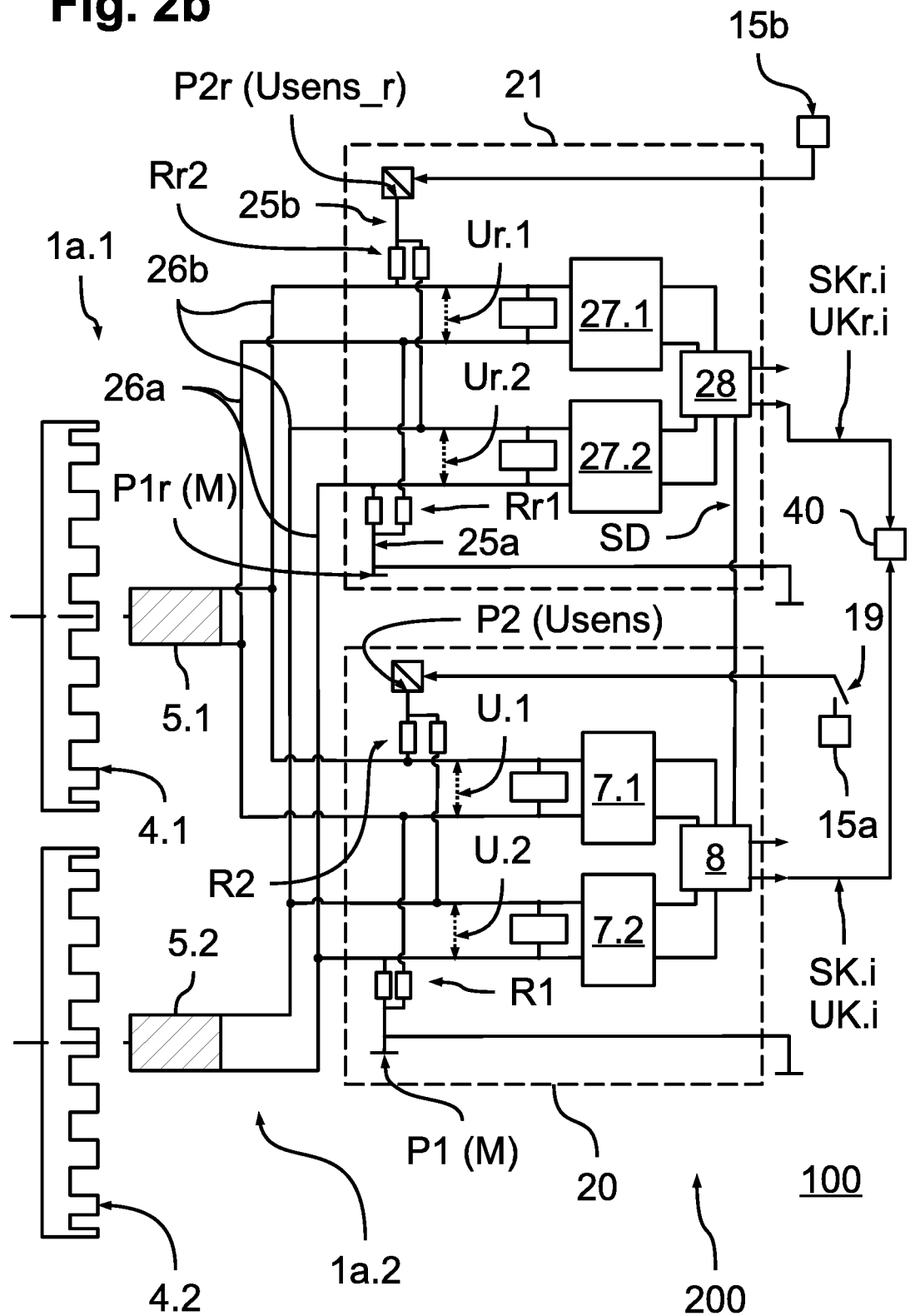

In the embodiment according to FIGS. 2a, 2b a sensor assembly 200 according to the invention is implemented, which has two of the inductive rotational speed sensor 1a.1, 1a.2 shown in FIG. 1a, i.e. i=2. The two rotational speed sensor 1a.1, 1a.2 here share the same evaluation module 20, i.e. the two inductive sensor elements 5.1, 5.2 are supplied by the evaluation module 20 in normal operation with a sensor voltage Usens from the same supply points P1, P2 via the load resistors R1, R2 assigned to the respective inductive sensor element 5.1, 5.2 and a measured voltage U.1, U2 assigned to the respective inductive sensor element 5.1, 5.2 can be evaluated for each inductive sensor element 5.1, 5.2 separately in a comparator module 7.1, 7.2 assigned to the respective inductive sensor element 5.1, 5.2. In the respective comparator module 7.1, 7.2, a comparator voltage UK.1, UK.2 assigned to the respective inductive sensor element 5.1, 5.2 or a comparator signal SK.1, SK.2 is determined as an output variable as described above and output for further use. In an analogous way, more than two inductive sensor elements 5.1, 5.2 can also be provided in the sensor assembly 200.

A plausibility check is carried out in accordance with this exemplary embodiment in a joint monitoring module 8, which monitors the output variables UK.1, UK.2, SK.1, SK.2 of both comparator modules 7.1, 7.2, wherein to do so these can in particular be compared with the respective measured voltage U.1, U.2 as described above.

In addition, in the sensor assembly 200 in parallel with the evaluation module 20 a redundancy module 21 is provided, which in accordance with FIGS. 2a, 2b is designed essentially identically to the evaluation module 20 and can also perform the same function, namely via a redundancy comparator module 27.1, 27.2 assigned to the respective inductive sensor element 5.1, 5.2 to generate a redundancy comparator voltage UKr.1, UKr.1 in the form of a square-wave voltage or a corresponding redundancy comparator signal SKr.1, SKr.2, which result from a redundancy measured voltage Ur.1, Ur.2 which is present in the redundancy module 21, by comparison with a voltage threshold U_th. The inputs and outputs of the respective redundancy comparator module 27.1, 27.2 are identical to the comparator module 7.1 shown in FIG. 1a.

From the respective redundancy comparator voltage UKr.1, UKr.2 or the respective redundancy comparator signal SKr.1, SKr.2 the rotation speed D.i of each wheel 2.i can also be derived, so that the driving assistance control module 40 can also use this to perform its open-loop and/or closed-loop control. If more than two or even just one inductive sensor element 5.i is provided, the redundancy module 21 will need to be adjusted in a corresponding way to the evaluation module 20.

In order to feed the redundancy measured voltage Ur.1, Ur.2, which essentially corresponds to the prevailing measured voltage U.1, U.2 in the evaluation module 20, to the redundancy module 21, for each of the inductive sensor elements 5.1, 5.2 redundancy lines 26a, 26b are provided, which as shown in FIG. 2a, 2b are connected identically to the sensor cables 6a, 6b (see FIG. 1a) and thus transmit the same voltage. Thus, the respective effective voltages UW.i of the respective inductive sensor element 5.1, 5.2 superimposed on the median voltage UM are also transmitted via the redundancy lines 26a, 26b to the redundancy module 21 or the respective redundancy comparator module 27.1, 27.2 located therein as a redundancy measured voltage Ur.1, Ur.2, to be able to process them accordingly. The median voltage UM is supplied in normal operation by the sensor voltage Usens provided in the evaluation module 20, as described above.

In order not to affect significantly the prevailing measured voltage U.1, U.2 in the evaluation module 20 in normal operation by the operation of the redundancy module 21, redundancy supply points P1r, P2r present in the redundancy module 21, via which a redundancy sensor voltage Usens_r can be defined as required via redundancy load resistors Rr1, Rr2 for supplying the inductive sensor elements 5.1, 5.2, are isolated from the respective redundancy line 26a, 26b by electrical switches 25a, 25b being opened accordingly. As a result, the redundancy lines 26a, 26b, are not connected to a potential in addition to the supply points P1, P2 in the evaluation module 20. This allows a double supply of the two inductive sensor elements 5.1, 5.2, and thus a mutual electrical interaction, to be avoided.

In normal operation, the redundancy module 21 is therefore first in a passive operating mode, in which the effective parameter UW.i of the respective inductive sensor element 5.i is merely "observed" via the respective redundancy measurand Ur.i, and no supply of the respective inductive sensor element 5.i takes place via the redundancy module 21. The evaluation module 20, on the other hand, is in an active operating mode in which both an observation of the respective effective voltage UW.i takes place via the respective measuring voltage U.i and a supply of the respective inductive sensor element 5.i takes place via the sensor voltage Usens.

Figure 4:
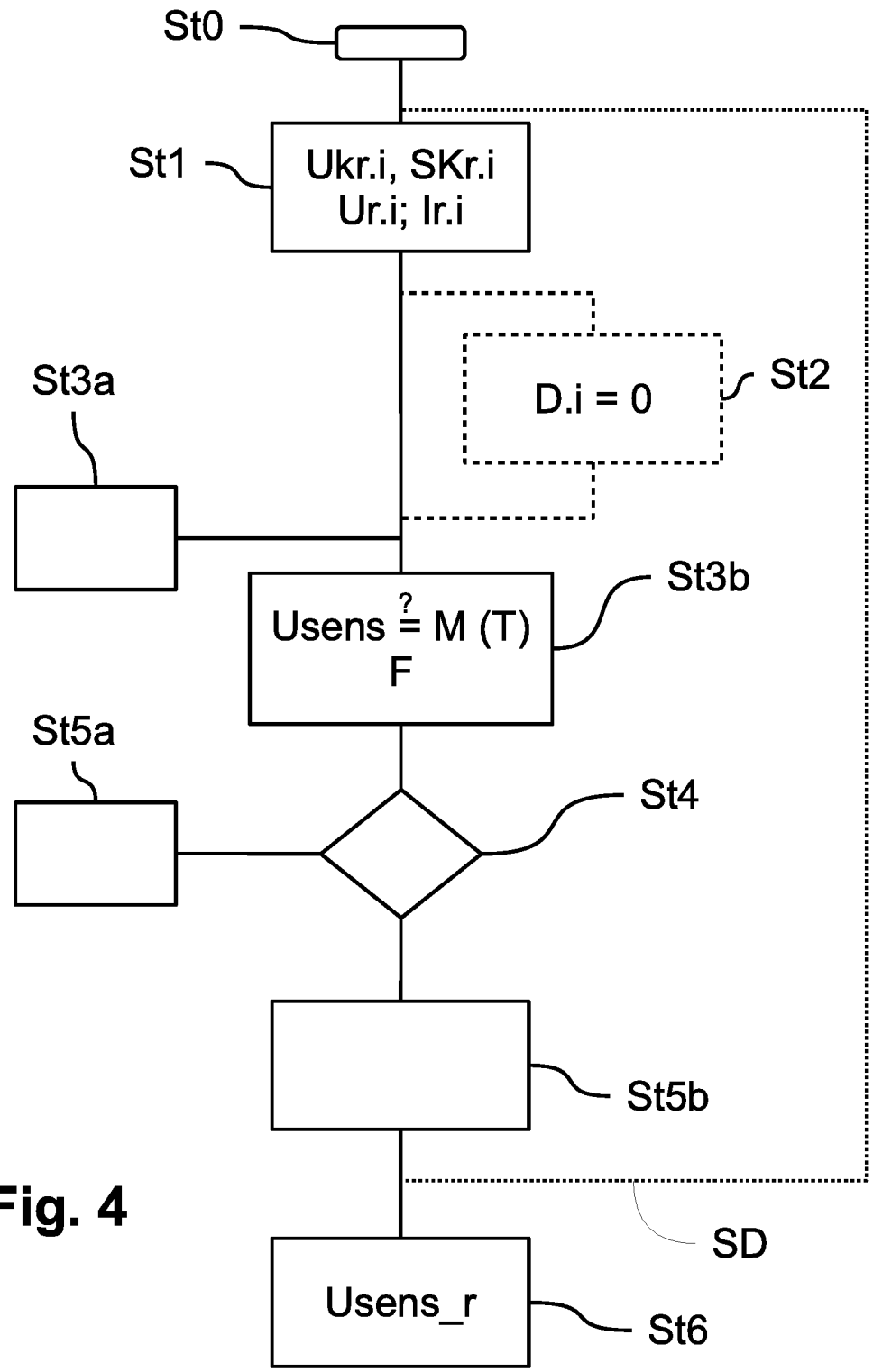
FIG. 4 shows a flow diagram of the method according to the invention.

In order to ensure a supply of the inductive sensor element 5.i with a voltage in the operation of the respective inductive rotational speed sensor 1a.i and also to enable an evaluation of the effective voltage UW.i and thus a detection and further processing of the rotation speed D.i of each wheel 2.i, via the redundancy module 21, typically via a redundancy monitoring module 28 integrated in the redundancy module 21, a monitoring of the functioning of the evaluation module 20 takes place, an example of which is illustrated in the flow chart in accordance with FIG. 4:

after the system has been initialized in an initial step St0, in the redundancy monitoring module 28 according to one design the analog redundancy measured voltage Ur.i output from one of the comparator modules 27.i, and the redundancy comparator voltage UKr.i—or the redundancy comparator signal SKr.i—can initially be monitored for a specific inductive sensor element 5.i, wherein to do so a plausibility check can firstly be performed in a first step St1. In other words, it is first determined whether the redundancy measured voltage Ur.i matches the output redundancy comparator voltage UKr.i of the respective inductive sensor element 5.i.

To this end different criteria may be applied, for example, whether a voltage value of the analog redundancy measured voltage Ur.i matches the rotation speed D.i determined from the redundancy comparator voltage Ukr.i, wherein at a higher speed D.i a higher voltage value of the analog redundancy measured voltage Ur.i is to be expected. This relationship can be stored, for example, in a characteristic curve in the redundancy monitoring module 28. It can also be checked whether plausible redundancy voltages Ur.i, UKr.i are output at all, i.e. whether a plausible or reasonable rotation speed D.i can be determined for the respective inductive sensor element 5.i at all.

If the two redundant voltages Ur.i, UKr.i—or the signal SKr.i—for the respective sensor element 5.i are plausible, and if at the same time it has been detected that a rotation speed D.i of zero is present, i.e. a redundancy comparator voltage UKr.i is present in a given time frame without voltage levels US, because the respective wheel 2.i is stationary or currently blocked, in a second step St2 it is tested whether the redundancy measured voltage Ur.i associated with this wheel 2.i corresponds to the median voltage UM generated as a result of the sensor voltage Usens. From this, at a rotation speed D.i of zero it can be deduced whether or not the sensor voltage Usens is specified by the evaluation module 20 via the supply points P1, P2 to the respective inductive sensor element 5.i.

If this is the case, it can be assumed that the respective inductive rotational speed sensor 1a.i or the respective inductive sensor element 5.i is being supplied with a sensor voltage Usens and is therefore functioning correctly (St3a).

If, however, in the second step St2—or even already in the first step St1—it is found that the mean value of the redundancy measured voltage Ur.i corresponds to the ground potential M within a fault tolerance T of, for example, 500 mV, in a third step St3b a fault case F is concluded.

In order to intervene appropriately, in the following steps it is assessed whether the respective inductive sensor element 5.i either has a sensor fault or is no longer being supplied with the sensor voltage Usens by the evaluation module 20, because, for example, the evaluation module 20 has a defect or malfunction, wherein in accordance with this design other inductive sensor elements 5.i are used for this purpose.

In order to be able to distinguish whether a sensor fault or a missing sensor voltage Usens is present, in a fourth step St4 for at least one other inductive sensor element 5.i of the sensor assembly 200, which as described and shown in FIG. 2a, 2b is also connected to the redundancy module 21 and which should also supplied with a sensor voltage Usens by the evaluation module 20, it is checked by the redundancy monitoring module 28 whether the redundancy measured voltage Ur.i associated to this inductive sensor element 5.i corresponds to the ground potential M within the tolerance T.

Thus, for example, if in the third step St3b a fault case F is detected, because the detected redundancy measured voltage Ur.1 assigned to the one inductive sensor element 5.1 in FIG. 2a corresponds to the ground potential M within the tolerance T, in the fourth step St4 it is checked whether the redundancy measured voltage Ur.2 assigned to the other inductive sensor element 5.2 in FIG. 2a also corresponds to the ground potential M within the tolerance T.

If this is the case for all inductive sensor elements 5.i supplied with the sensor voltage Usens by the evaluation module 20 and for all those connected to the redundancy module 21 at the same time, in a fifth step St5b it is concluded that a failure of the supply of the individual inductive sensor elements 5.i with the sensor voltage Usens may be present. In other words, it is found that due to any malfunction of the evaluation module 20 the sensor voltage Usens cannot be transmitted via the sensor cables 6a, 6b to all inductive sensor elements 5.i of the sensor assembly 200.

If, on the other hand, only some individual inductive sensor elements 5.i that are all supplied with the sensor voltage Usens by the same evaluation module 20 are affected, then in an alternative fifth step St5a a different malfunction is concluded, possibly a sensor defect, and a corresponding warning is output. If the one redundancy measured voltage Ur.1 corresponds to the ground potential M in FIG. 2a and the other redundancy measured voltage Ur.2 does not correspond to the ground potential M within the tolerance T but, for example, to the median voltage UM, then it is highly likely that no malfunction of the evaluation module 20 is present with regard to supplying the sensor voltage Usens. In this alternative, in the context of the method according to the invention, no fallback level is implemented.

In order nevertheless to ensure a continued operation of the inductive speed sensor or sensors 1a.1 in the event of a high probability of failure of the power supply of the individual inductive sensor elements 5.i via the sensor voltage Usens provided by the evaluation module 20, in a sixth step St6 as shown in FIG. 2b the electrical switches 25a, 25b are closed and the redundancy supply points P1r, P2r are connected to the redundancy lines 26a, 26b, so that for each of the individual inductive sensor elements 5.i a redundancy sensor voltage Usens_r is provided. The opening of the switches 25a, 25b in this case can take place, for example, by the redundancy monitoring module 28, which can electrically control the electrical switches 25a, 25b.

In the case, the redundancy module 21 thus performs the full function (supply and processing) of the evaluation module 20 found to be defective and the redundancy comparator voltage UKr.i output by the redundancy module 21 for the respective inductive sensor element 5.i can be used for the open-loop and/or closed-loop control in the driving assistance control module 40. Other features of the evaluation module 20, for example additional diagnostic functions, can be performed by the redundancy module 21 due to its almost identical construction and virtually identical operating principle.

Thus, in this design using further inductive sensor elements 5.i of the sensor assembly 200 a functional capacity of the evaluation module 20 can be deduced. With only one inductive sensor element 5.i this monitoring is therefore not possible. In fact, at least two inductive sensor elements 5.i are typically utilized.

Alternatively or in addition, however, it can also be provided in one design that the functions are already taken over by the redundancy module 21 in step St6 when the evaluation module 20 is changed into a fault mode, without the previous steps St1 to St5 needing to be carried out. This can be carried out if in a self-diagnosis the processing module 20 detects that a fault or a malfunction is present and as a result, a connection to the first energy source 15a is switched off automatically, in order to change over into the passive operating mode as indicated in FIG. 2b by a supply switch 19. This variant is represented by the parallel path in FIG. 4, i.e. parallel to the steps St1 to St5 the diagnostic signal SD can also always be read out and evaluated.

In this case, the evaluation module 20 can signal to the redundancy module 21 via a diagnostic signal SD that a malfunction has occurred and that the evaluation module 20 is transferring into the passive operating mode in which, consequently, no sensor voltage Usens is output either. In this case, a monitoring of the functional capacity of the evaluation module 20 therefore also takes place via the diagnostic signal SD and by switching over the electrical switches 25a, 25b, the redundancy module 21 can assume the supply and evaluation tasks and therefore the whole operation of the inductive speed sensor(s) 1a.i. In this case, in the sensor assembly 200 any number of inductive sensor elements 5.i with i>=1 may be present, i.e. even only one inductive sensor element 5.1, since the detection of the functional capability of the evaluation module 20 is not monitored via further inductive sensor elements 5.i.

As a result, in both versions in an electrically controlled brake system a fallback level can be implemented which intervenes if the supply of the inductive sensor elements 5.i by the evaluation module 20 fails, which can be easily detected by the redundancy module 21 itself.

The power supply of the evaluation module 20 and the redundancy module 21 in this case are provided separately from each other via two energy sources 15a, 15b which are independent of each other, so that in the event of a defect in a first power source 15a, which supplies the evaluation module 20 with energy, a second energy source 15b, which supplies the redundancy module 21 with energy, remains unaffected. This is implemented, for example, via a galvanic separation when only one power supply is used, such as a vehicle battery or an alternator, or else by the provision of two separate energy sources 15a, 15b. The energy sources 15a, 15b here ensure that the respective module 20, 21 can provide the redundancy/sensor voltage Usens, Usens_r, and that the redundancy/comparator module 7.i, 27.i and the redundancy/monitoring module 8, 28 can evaluate and process the respective voltages and/or signals according to their mode of operation.

Figure 3A:
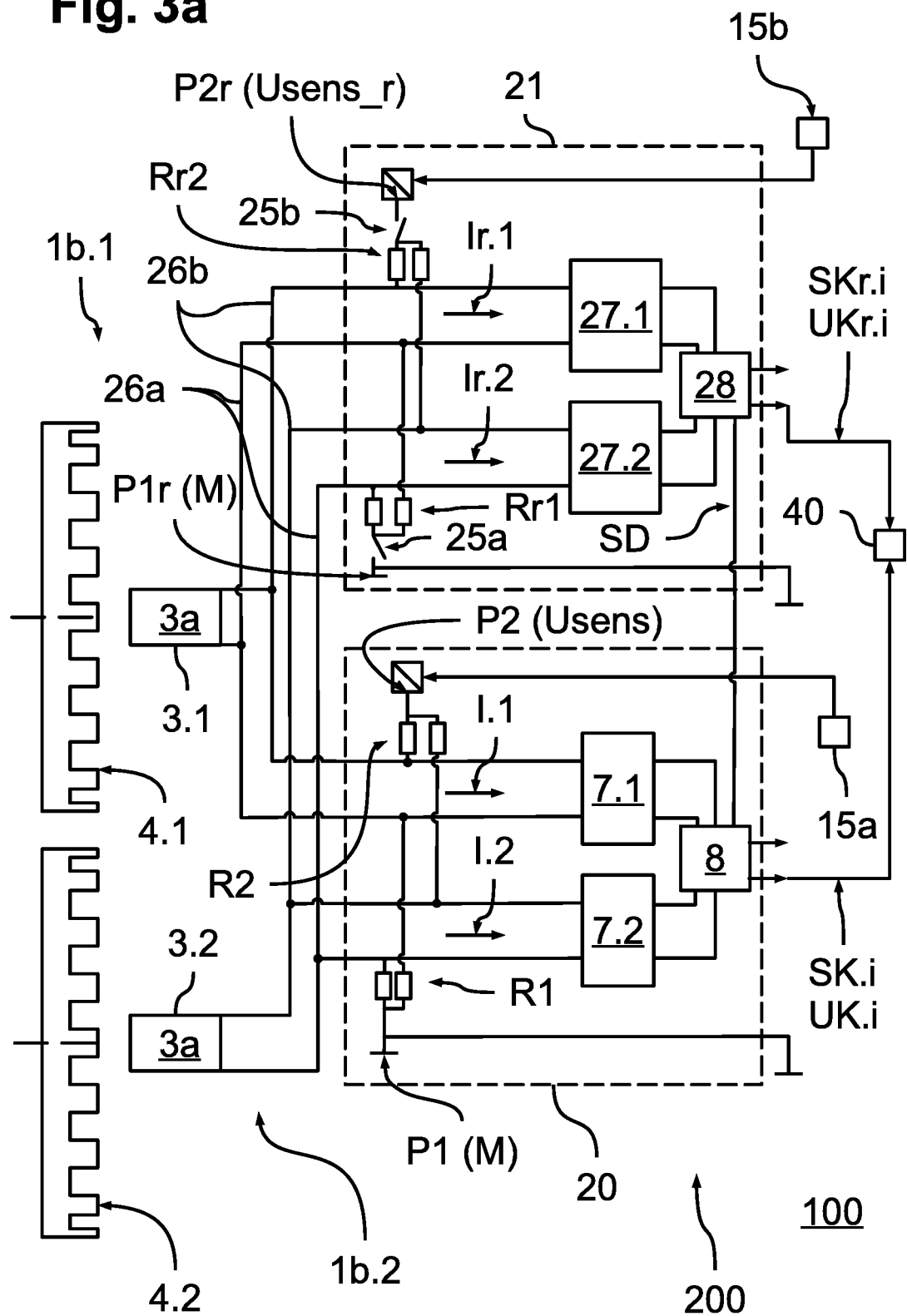
FIG. 3a shows a schematic view of an active sensor assembly with two active rotational speed sensor in a normal operation.

According to FIG. 3a a further design of the sensor assembly 200 with two active rotational speed sensor 1b.i is shown schematically. In this case, on the relevant wheel 2.i an active sensor element 3.i is present, which is designed, for example, as a Hall sensor element 3a. In this device, on approaching a magnet tooth 4a of the magnet wheel 4.i a change is produced in an effective current IW.i flowing through the active sensor element 3.i. Due to the potentials M, Usens prevailing at the supply points P1, P2 of the evaluation module 20, or due to the sensor voltage Usens acting on the active sensor element 3.i through the load resistors R1, R2 via the sensor cables 6a, 6b in normal operation, a median current IM is superimposed on the effective current IW.i as an effective parameter. This superposition is transmitted as a measured current I.i via the sensor cables 6a, 6b to the evaluation module 20 and received by the respective comparator module 7.i. As an example, such a measured current I.i is shown in FIG. 3b as a measurand.

If the active sensor element 3.i is designed to output further sensor information via a VDA-AK protocol, these can be additionally used for a diagnosis. In that case, the sensor information is appropriately encoded in the measurand, wherein to this end in accordance with FIG. 3b following a sensor current pulse IS occurring in the effective current IW.i, which occurs as a result of the interaction of the magnet wheel 4.i with the active sensor element 3.i and which is greater than or equal to a current threshold value I_th, additional diagnostic current pulses DS of differing duration and with roughly half the current threshold value I_th are transmitted. By using the duration of the diagnostic current pulses DS certain sensor information, in particular indicating a status of the active rotational speed sensor 1b.i, can be transmitted.

The operating principle of the evaluation module 20 is analogous to the already described evaluation module 20 for an inductive sensor element 5.i in accordance with FIGS. 1a, 2a and 2b. Accordingly, the measuring current I.i assigned to the respective active sensor element 3.i is compared with the current threshold value I_th by the respective comparator module 7.i. If passing over the magnetic tooth 4a on the respective active sensor element 3.i can be concluded, which in FIG. 3b is always the case on a sensor current pulse IS in the measured current I.i, a corresponding voltage pulse US is generated and output by the comparator module 7.i in a comparator voltage UK.i for further processing and monitoring. From this, as also previously described for an inductive sensor element 5.i, having knowledge of the number of magnet teeth 4a, the rotation speed D.i of the magnet wheel 4.i or the wheel 2.i can be concluded. Furthermore, from the measuring current I.i the comparator module 7.i a corresponding analog voltage can also be generated and output as measured voltage U.i at the analog output 7d of the comparator module 7.i.

The structure and operating principle of the redundancy module 21 is similar to the design of the sensor assembly 200 with inductive sensor elements 5.i, i.e. in normal operation the redundancy module 21 is initially passive and observes the redundancy measured current Ir.i which is fed into the redundancy module 21 via the redundancy lines 26a, 26b, or a redundancy measuring voltage Ur.i generated from this in the redundancy comparator module 27.i and the redundancy comparator voltage UKr.i or the redundancy comparator signal Skr.i also output by the redundancy comparator module 27.i, each of which characterizes the rotation speed D.i.

In the presence of the corresponding variant of the active sensor element 3.i with the VDA-AK protocol, the sensor information transferred from the diagnostic current pulses DS can additionally be monitored.

Thus, the same or comparable parameters as already described for the inductive design of the sensor assembly 200 are available, and the method specified in FIG. 4 can be carried out in a similar way in the redundancy monitoring module 28 in order to monitor a function of the evaluation module 20 in relation to a supply of the in this case active sensor elements 3.i with the sensor voltage Usens.

On the one hand, this can take place after checking the plausibility of the currents or voltages (cf. St1) by monitoring the median current IM, wherein in the event of a dropout of the sensor voltage Usens provided by the evaluation module 20 the median current IM falls to zero within the fault tolerance T, which corresponds to supplying the active sensor element 3.i with the ground potential M within the fault tolerance T (cf. St2, St3b).

If this is detected for all active sensor elements 3.i of the sensor assembly 200 (cf. St4, St5b), the redundancy module 21 can perform the operation of the active rotational speed sensor 1b.i and accordingly ensure both a supply and an evaluation (cf. St6).

On the other hand, however, the monitoring can also be carried out via the diagnostic signal SD and in the event of a reported malfunction the redundancy module 21 can intervene redundantly.

If the VDA-AK protocol for the active rotational speed sensor 1b.i is supported, in addition, the sensor information can also be taken into account during the monitoring. For example, it can also be detected whether the diagnostic current pulses DS are transmitted via the redundancy measured current Ir.i and on the basis of this it can be detected whether the active sensor elements 3.i are being supplied, because in the event of a failure of the supply no more diagnostic current pulses DS will be able to be detected either.

LIST OF REFERENCE NUMERALS (PART OF THE DESCRIPTION)

1a.i inductive rotation speed sensor
1b.i active rotation speed sensor
2.i wheel
3.i active sensor element
3a Hall sensor element
4.i magnet wheel
4a magnetic tooth
4b magnet gap
5.i inductive sensor element
5a magnetic core
5b coil winding
6a, 6b sensor cables
7.i comparator module 7a, 7b comparator inputs
7c comparator output
7d analog output
8 monitoring module
9 filter arrangement
15a, 15b energy source
19 supply switch
20 evaluation module
21 redundancy module
25a, 25b electrical switches
26a, 26b redundancy lines
27.i redundancy comparator module
28 redundancy monitoring module
40 driver assistance control module
100 vehicle
200 monitoring arrangement
A distance
D.i rotation speed
DS diagnostic current pulse
F error case
I_th current threshold value
I.i measured current
IM median current
Ir.i redundancy measured current
IS sensor current pulse
IW.i effective current
M ground potential
P1 first supply point
P1r first redundancy supply point
P2 second supply point
P2r second redundancy supply point
R1, R2 load resistors
Rr1, Rr2 redundancy load resistors
SD diagnostic signal
T fault tolerance
UW.i effective voltage
UK comparator voltage
UKr redundancy-comparator voltage
U.i measured voltage
Ur.i redundancy measured voltage
UM median voltage
US voltage pulse
Usens sensor voltage
Usens_r redundancy sensor voltage
U_th voltage threshold
St0, St1, St2, St3a, St3b, St4, St5a, St5b, St6 steps of the method The terms "comprising" or "comprise" are used herein in their broadest sense to mean and encompass the notions of "including," "include," "consist(ing) essentially of," and "consist(ing) of. The use of "for example," "e.g.," "such as," and "including" to list illustrative examples does not limit to only the listed examples. Thus, "for example" or "such as" means "for example, but not limited to" or "such as, but not limited to" and encompasses other similar or equivalent examples. The term "about" as used herein serves to reasonably encompass or describe minor variations in numerical values measured by instrumental analysis or as a result of sample handling. Such minor variations may be in the order of ±0-25, ±0-10, ±0-5, or ±0-2.5, % of the numerical values. Further, The term "about" applies to both numerical values when associated with a range of values. More-over, the term "about" may apply to numerical values even when not explicitly stated.

Generally, as used herein a hyphen "-" or dash "—" in a range of values is "to" or "through"; a ">" is "above" or "greater-than"; a "≥" is "at least" or "greater-than or equal to"; a "<" is "below" or "less-than"; and a "≤" is "at most" or "less-than or equal to." On an individual basis, each of the aforementioned applications for patent, patents, and/or patent application publications, is expressly incorporated herein by reference in its entirety in one or more non-limiting embodiments.

It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, it is to be appreciated that different, spe-cial, and/or unexpected results may be obtained from each member of the respective Markush group independent from all other Markush members. Each member of a Markush group may be relied upon individually and or in combination and provides adequate support for specific embodiments within the scope of the appended claims.

The present invention has been described herein in an illustrative manner, and it is to be understood that the terminology which has been used is intended to be in the nature of words of description rather than of limitation. Many modifications and variations of the present invention are possible in light of the above teachings. The present invention may be practiced otherwise than as specifically described within the scope of the appended claims. The subject matter of all combinations of independent and dependent claims, both single and multiple dependent, is herein expressly contemplated.

What is claimed is:

1. A method for operating a rotational speed sensor comprising a sensor element in a vehicle, wherein the sensor element interacts with a magnet wheel on a wheel of the vehicle, said method comprising:

evaluating an effective parameter generated by the interaction of the magnet wheel with the sensor element in the form of a measurand in an evaluation module and, depending on the measurand, outputting an output variable characterizing the rotational speed of the wheel, wherein the sensor element is supplied via the evaluation module with a sensor voltage influencing the measurand, and monitoring the functional capability of the evaluation module to establish whether the sensor element is or can be supplied from the evaluation module with the sensor voltage, wherein, in the event of a malfunction of the evaluation module as a result of which the sensor element no longer is or can be supplied with the sensor voltage from the evaluation module, a redundancy sensor voltage is provided by a redundancy module independent of the evaluation module, the sensor element instead being supplied with the voltage so as to form a redundant voltage supply of the sensor element, wherein monitoring of the functionality of the evaluation module takes place via the redundancy module, wherein in the redundancy module, at least the following steps are performed to monitor the functionality of the evaluation module:

detecting a redundancy measurand that appears in the redundancy module, wherein the redundancy measurand results from the interaction of the magnet wheel with the sensor element which is supplied with the sensor voltage specified by the evaluation module; and determining whether the redundancy measurand indicates that a sensor voltage is present, which corresponds to a ground potential within a fault tolerance.

2. The method as claimed in claim 1, wherein in the event of a malfunction of the evaluation module, as a result of which the sensor element no longer is or can be supplied with the sensor voltage by the evaluation module, the effective parameter generated by the interaction of the magnet wheel with the sensor element is evaluated in the form of a redundancy measurand in the redundancy module, and depending on the redundancy measurand a redundancy output variable characterizing the speed of the wheel is output by the redundancy module to form a redundant evaluation.

3. The method as claimed in claim 1, wherein in the event of a malfunction of the evaluation module, as a result of which the sensor element no longer is or can be supplied with the sensor voltage from the evaluation module, redundancy supply points of the redundancy module can be electrically conductively connected to the sensor element via redundancy lines in such a way that the sensor element is supplied with a redundancy sensor voltage provided by the redundant supply points, and the redundancy supply points are otherwise electrically isolated from the sensor element.

4. The method as claimed in claim 3, wherein the connection of the redundancy supply points to the sensor element and the isolation of the redundancy supply points from the sensor element are carried out via electrical switches, the electrical switches being opened or closed depending on the functionality of the evaluation module.

5. The method as claimed in claim 1, wherein the redundancy module monitors a diagnostic signal output by the evaluation module, wherein the diagnostic signal indicates whether the sensor element is or can be supplied with the sensor voltage via the evaluation module.

6. The method as claimed in claim 1, wherein in the presence of a redundancy measurand which indicates a sensor voltage corresponding to a ground potential within the fault tolerance, a malfunction of the evaluation module is concluded, as a result of which the sensor element no longer is or can be supplied with the sensor voltage by the evaluation module, and wherein if a redundancy measurand, which is assigned to at least one other sensor element of at least one additional rotational speed sensor of the same sensor assembly, also indicates a sensor voltage corresponding to a ground potential within the fault tolerance, then the at least one other sensor element is also supplied with the sensor voltage by the same evaluation module and is also monitored by the redundancy module for a malfunction.

7. The method as claimed in claim 1, wherein after the detection the redundancy measurand is first plausibility-checked, wherein to do so, in a redundancy comparator module of the redundancy module, from the redundancy measurand a redundancy comparator voltage or a redundancy comparator signal is generated as an output variable, each of which specifies whether, as a result of an interaction of the sensor element with a magnet wheel tooth of the magnet wheel, the redundancy measurand deviates by more than a threshold from the median voltage or the median current, and the redundancy measurand is compared with the redundancy comparator voltage or the redundancy comparator signal to detect inconsistencies in the detected redundancy measurand.

8. A method for operating a rotational speed sensor comprising a sensor element in a vehicle, wherein the sensor element interacts with a magnet wheel on a wheel of the vehicle, said method comprising:

evaluating an effective parameter generated by the interaction of the magnet wheel with the sensor element in the form of a measurand in an evaluation module and, depending on the measurand, outputting an output variable characterizing the rotational speed of the wheel, wherein the sensor element is supplied via the evaluation module with a sensor voltage influencing the measurand, and monitoring the functional capability of the evaluation module to establish whether the sensor element is or can be supplied from the evaluation module with the sensor voltage, wherein, in the event of a malfunction of the evaluation module as a result of which the sensor element no longer is or can be supplied with the sensor voltage from the evaluation module, a redundancy sensor voltage is provided by a redundancy module independent of the evaluation module, the sensor element instead being supplied with the voltage so as to form a redundant voltage supply of the sensor element, wherein when a stationary state of the wheel is detected, the method further comprises determining whether the redundancy measurand corresponds to a median voltage and/or a median current, which appears when the wheel is stationary due to supplying the sensor element with the sensor voltage without any interaction of the sensor element with the magnet wheel.

9. A method for operating a rotational speed sensor comprising a sensor element in a vehicle, wherein the sensor element interacts with a magnet wheel on a wheel of the vehicle, said method comprising:

evaluating an effective parameter generated by the interaction of the magnet wheel with the sensor element in the form of a measurand in an evaluation module and, depending on the measurand, outputting an output variable characterizing the rotational speed of the wheel, wherein the sensor element is supplied via the evaluation module with a sensor voltage influencing the measurand, and monitoring the functional capability of the evaluation module to establish whether the sensor element is or can be supplied from the evaluation module with the sensor voltage, wherein, in the event of a malfunction of the evaluation module as a result of which the sensor element no longer is or can be supplied with the sensor voltage from the evaluation module, a redundancy sensor voltage is provided by a redundancy module independent of the evaluation module, the sensor element instead being supplied with the voltage so as to form a redundant voltage supply of the sensor element, wherein:
in the evaluation module a measured voltage is processed as the measurand and in the redundancy module a redundancy measured voltage is processed as the redundancy measurand, wherein the measured voltage and the redundancy measured voltage result from the interaction of the magnet wheel with the sensor element superimposed with a median voltage resulting from the sensor voltage or, in the event of a malfunction being detected, from the redundancy sensor voltage, or in the evaluation module a measured current is processed as the measurand and in the redundancy module a redundancy measured current is processed as the redundancy measurand, wherein the measured current and the redundancy measured current result from the interaction of the magnet wheel with the sensor element superimposed with a median current resulting from the sensor voltage or, in the event of a malfunction being detected, from the redundancy sensor voltage.

10. The method as claimed in claim 9, wherein:

the measured voltage and the redundancy measured voltage are produced as a function of an effective voltage generated in an inductive sensor element due to the interaction with the magnet wheel and the measured current and the redundancy measured current are produced as a function of an effective current generated in an active sensor element as a result of the interaction with the magnet wheel.

* * * * *